(12) United States Patent
Urakami

(10) Patent No.: US 11,343,417 B2
(45) Date of Patent: May 24, 2022

(54) IMAGE PICKUP UNIT AND IMAGE PICKUP APPARATUS

(71) Applicant: CANON KABUSHIKI KAISHA, Tokyo (JP)

(72) Inventor: Toshifumi Urakami, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/176,967

(22) Filed: Feb. 16, 2021

(65) Prior Publication Data

US 2021/0258455 A1   Aug. 19, 2021

(30) Foreign Application Priority Data

Feb. 18, 2020  (JP) .............................. JP2020-025077

(51) Int. Cl.
*H04N 5/225* (2006.01)
*H01L 27/146* (2006.01)

(52) U.S. Cl.
CPC ..... *H04N 5/2253* (2013.01); *H01L 27/14618* (2013.01)

(58) Field of Classification Search
CPC .................. H01L 27/14618; H01L 27/146
See application file for complete search history.

(56) References Cited

U.S. PATENT DOCUMENTS

2006/0278810 A1* 12/2006 Kobayashi ......... H04N 5/22521
                                                         250/208.1
2017/0092689 A1*  3/2017 Deng ................ H01L 27/14685

FOREIGN PATENT DOCUMENTS

JP         2007-227673 A      9/2007
JP         2015-012211 A      1/2015

* cited by examiner

*Primary Examiner* — Nelson D. Hernández Hernández
(74) *Attorney, Agent, or Firm* — Cowan, Liebowitz & Latman, P.C.

(57) ABSTRACT

An image pickup unit includes an image sensor in which a sensor chip is mounted on a first substrate surface of a substrate having a long side and a short side, and electronic components are mounted on a second substrate surface opposite to the first substrate surface, and a holder having an opening and configured to hold the image sensor. The opening has an inner surface parallel to the short side of the substrate, and the image sensor is fixed to the holder with an adhesive that contacts the inner surface and an adhesion area on the second substrate surface of the substrate that is outside the electronic component.

11 Claims, 7 Drawing Sheets

IMAGE PICKUP UNIT AND IMAGE PICKUP APPARATUS

BACKGROUND OF THE INVENTION

Field of the Invention

The present invention relates to an image pickup unit suitable for an image pickup apparatus, such as a digital camera and a portable terminal.

Description of the Related Art

In some image pickup apparatuses, an image sensor, such as a CCD sensor and a CMOS sensor, is adhered and fixed to a holder to form an image pickup unit, and the image pickup unit is fixed to a body of the image pickup apparatus. Japanese Patent Laid-Open No. ("JP") 2007-227673 discloses a structure in which an image sensor disposed so as to cover an opening is fixed onto a holder by pouring an adhesive agent into the opening provided in the holder (fixing member).

On the other hand, a so-called packageless structure has been used for an image sensor, in which a sensor chip is directly mounted on a printed circuit board made of glass epoxy or the like, as disclosed in JP 2015-012211, in addition to a conventional type in which a sensor chip made of a silicon substrate or the like is mounted in a cavity provided in a ceramic package.

However, when an image sensor having a packageless structure is adhered to the holder, the linear expansion coefficient of the printed circuit board is larger than that of ceramic, and the rigidity of the printed circuit board is lower than that of ceramic. Therefore, a deformation amount of the image sensor in the focus direction (optical axis direction) caused by temperature changes tends to be large. Since various circuit devices for driving the sensor chip are mounted on the printed circuit board, it is difficult to increase the adhesive region in order to secure the adhesion holding strength of the printed circuit board by the holder.

SUMMARY OF THE INVENTION

The present invention provides an image pickup unit that can restrain an image sensor having a packageless structure from deforming in a focus direction due to temperature changes while ensuring a sufficient adhesion holding strength between the image sensor and a holder.

An image pickup unit according to one aspect of the present invention includes an image sensor in which a sensor chip is mounted on a first substrate surface of a substrate having a long side and a short side, and electronic components are mounted on a second substrate surface opposite to the first substrate surface, and a holder having an opening and configured to hold the image sensor. The opening has an inner surface parallel to the short side of the substrate. The image sensor is fixed to the holder with an adhesive that contacts the inner surface and an adhesion area on the second substrate surface of the substrate that is outside the electronic component.

An image pickup apparatus having the above image pickup unit also constitutes another aspect of the present invention.

Further features of the present invention will become apparent from the following description of exemplary embodiments with reference to the attached drawings.

DESCRIPTION OF THE EMBODIMENTS

Referring now to the accompanying drawings, a description will be given of embodiments according to the present invention.

First Embodiment

Figure 1:
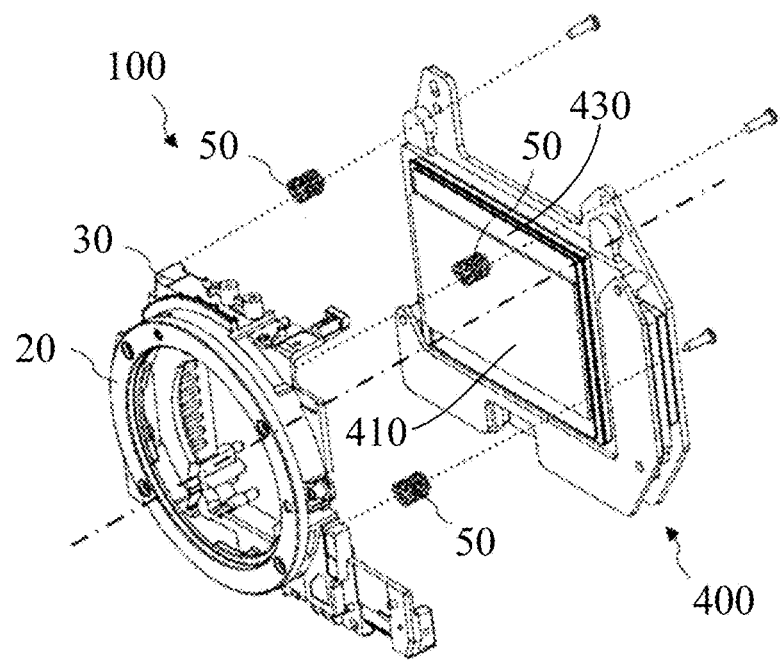
FIG. 1 is an exploded perspective view showing a mount part, a body base, and an image pickup unit in a camera according to a first embodiment of the present invention.
Figure 2:
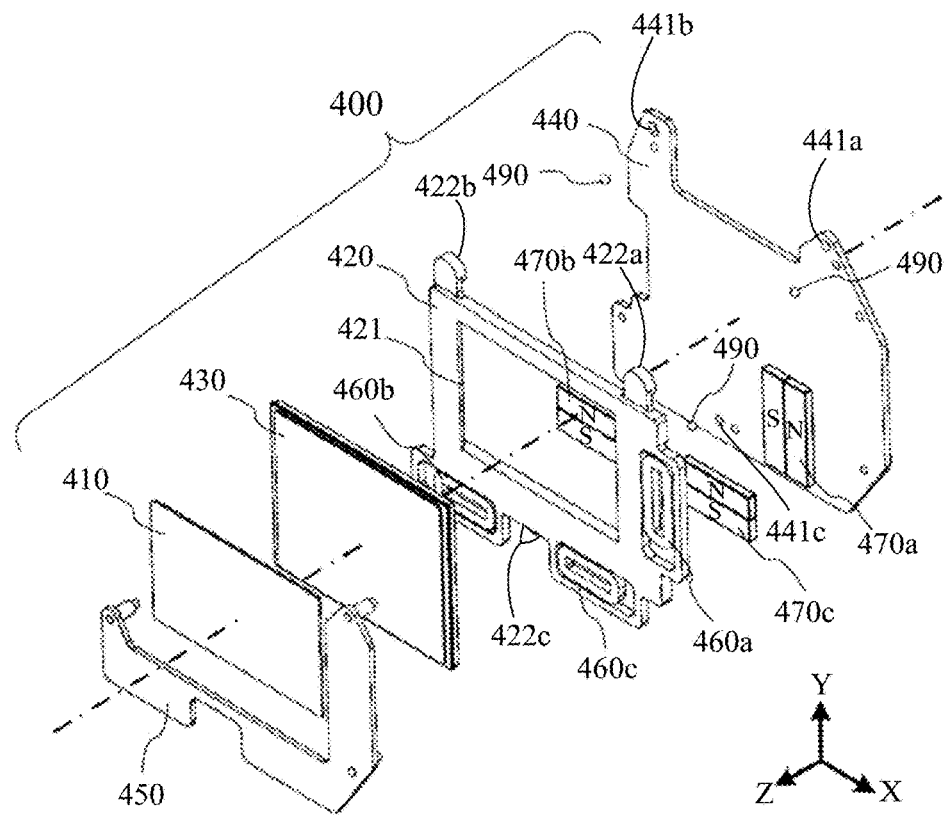
FIG. 2 is an exploded perspective view of the image pickup unit.

FIG. 1 illustrates, in an exploded manner, part of an interchangeable lens camera simply referred to as a camera hereinafter) 100 serving as an image pickup apparatus provided with an image pickup unit 400 according to a first embodiment of the present invention. FIG. 1 illustrates the image pickup unit 400, a mount part 20, and a body base 30. FIG. 2 illustrates the image pickup unit 400 in an exploded manner. In FIGS. 1 and 2, an alternate long and short dash line indicates an optical axis from the lens unit to the image pickup unit 400.

An unillustrated lens unit is attached to and detachable from the mount part 20. The body base 30 is a housing of the camera 100, and various components of the camera 100 are attached to the body base 30. The mount part 20 is attached to a front surface (surface on the object side) of the body base 30. The image pickup unit 400 is attached to a rear part (image sensor side) of the body base 30. An unillustrated exterior cover, shutter unit, electric board, and the like of the camera 100 are also attached to the body base 30.

The image pickup unit 400 has an image sensor (image pickup element) 430. The image sensor 430 uses a CMOS sensor, a CCD sensor, or the like, and captures (photoelectrically converts) an object image serving as an optical image formed by the lens unit, and outputs an image signal. The image pickup unit 400 is fixed onto the body base 30 with screws via an adjusting spring 50 such that a distance from the mount plane, which is a mounting reference plane of the lens unit in the mount part 20, to an imaging plane of the image sensor 430 is a predetermined distance, and the mount plane and the imaging plane are parallel to each other.

Referring now to FIG. 2, a more detailed description will be given of the configuration of the image pickup unit 400. In FIG. 2, the optical axis is set to a Z axis and the +Z direction is set to the front side. The horizontal axis orthogonal to the Z axis is set to the X axis, and the vertical axis orthogonal to the Z axis and the X axis is set to the Y axis.

In order to suppress image blurs in an X direction in which the X axis extends, a Y direction in which the Y axis extends, and a Z-axis rotating direction, the image pickup unit 400 can move (shift) the image sensor 430 in the X direction and the Y direction, and rotate (roll) it in the Z-axis rotating direction.

An optical low-pass filter 410 is attached to the front surface (imaging surface) of the image sensor 430. The optical low-pass filter 410 is a rectangular birefringent plate made of a single crystal.

A shift holder 420 serving as a holder disposed behind the image sensor 430 has an opening 421, and holds the image sensor 430 disposed so as to cover the front surface of the opening 421. The shift holder 420 is supported so that it can shift in the X and Y directions and roll in the Z-axis rotating direction relative to the shift base 440. The image sensor 430 is adhered and fixed to the left and right sides of the opening 421 of the shift holder 420. The image sensor 430 and the shift holder 420 form a movable part.

The shift base 440 is disposed behind the shift holder 420, and constitutes a base member of the image pickup unit 400 together with a front base 450 described later. The front base 450 is a member disposed on the front side of the shift holder 420 and the image sensor 430 and having an L-shape when viewed from the front side, and integrated with the shift base 440. The shift base 440 and the front base 450 are made of a soft magnetic material such as iron. The shift base 440 is fixed onto the body base 30 described above with screws via the adjusting spring 50.

An X-driving coil 460a and Y-driving coils 460b and 460c are soldered to an unillustrated flexible board and adhered and fixed to the shift holder 420. The X-driving coil 460a is disposed on the right side of the image sensor 430 when viewed from the front side, and the Y-driving coils 460b and 460c are disposed symmetrically with respect to the YZ plane that passes through the optical axis on the lower side of the image sensor 430.

An X magnet 470a and Y magnets 470b and 470c are adhered and fixed to the shift base 440. The X magnet 470a is a permanent magnet having N poles and S poles arranged in the X direction, and the Y magnets 470b and 470c are permanent magnets having N poles and S poles arranged in the Y direction. These magnets 470a, 470b, and 470c are arranged so as to face the driving coils 460a, 460b, and 460c, respectively.

A plurality of (three in this embodiment) balls 490 serving as rolling members are arranged between the shift holder 420 and the shift base 440, are held by ball holding holes 441a, 441b, and 441c provided in the shift base 440, and contact ball receiving surfaces 422a, 422b, and 422c provided to the shift holder 420. The shift holder 420 is biased towards the shift base 440 by a magnetic attraction member or elastic member (not shown). Thereby, the shift holder 420 and the shift base 440 sandwich each ball 490 in a pressed state, and the shift holder 420 holding the image sensor 430 is positioned (supported) in the optical axis direction relative to the shift base 440. Each ball 490 rolls and reduces the movement resistance of the shift holder 420 when the shift holder 420 shifts and rolls relative to the shift base 440.

The X-driving coil 460a and the Y-driving coils 460b and 460c, together with the X magnet 470a and the magnets 470b and 470c, form an electromagnetic actuator that moves the shift holder 420 in the XY plane. When a current flows through each coil, a Lorentz force is generated, and the shift holder 420 can be moved by the Lorentz force. By controlling the electrification amount supplied to each coil, the shift holder 420 can be shifted in the X and Y directions, or rolled around the Z axis. Image blurs can be reduced by controlling the electrification amount to each coil so as to shift or roll the image sensor 430 in the direction opposite to the blurring direction according to the shake applied to the camera 100.

Figure 3:
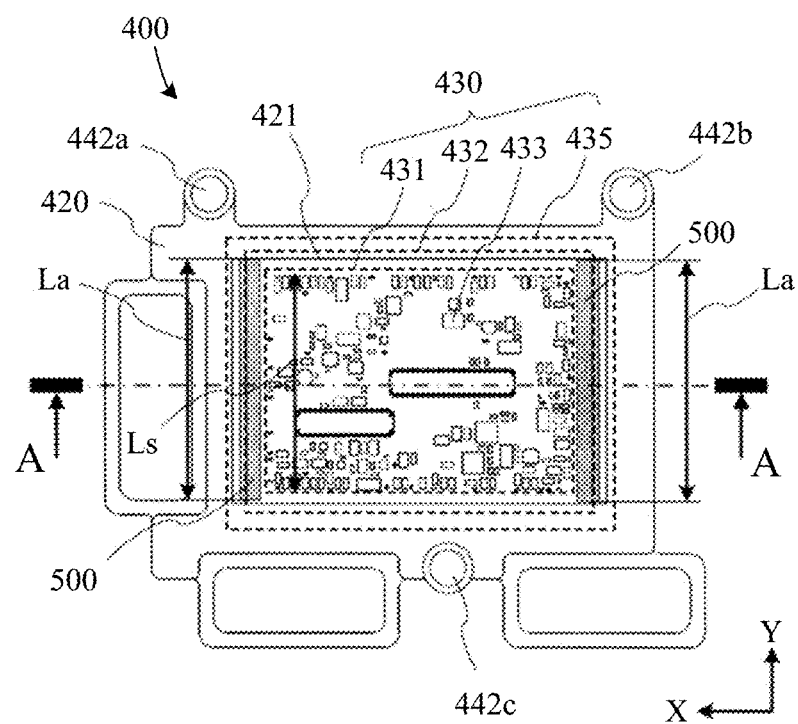
FIG. 3 is a rear view of the image pickup unit.
Figure 4:
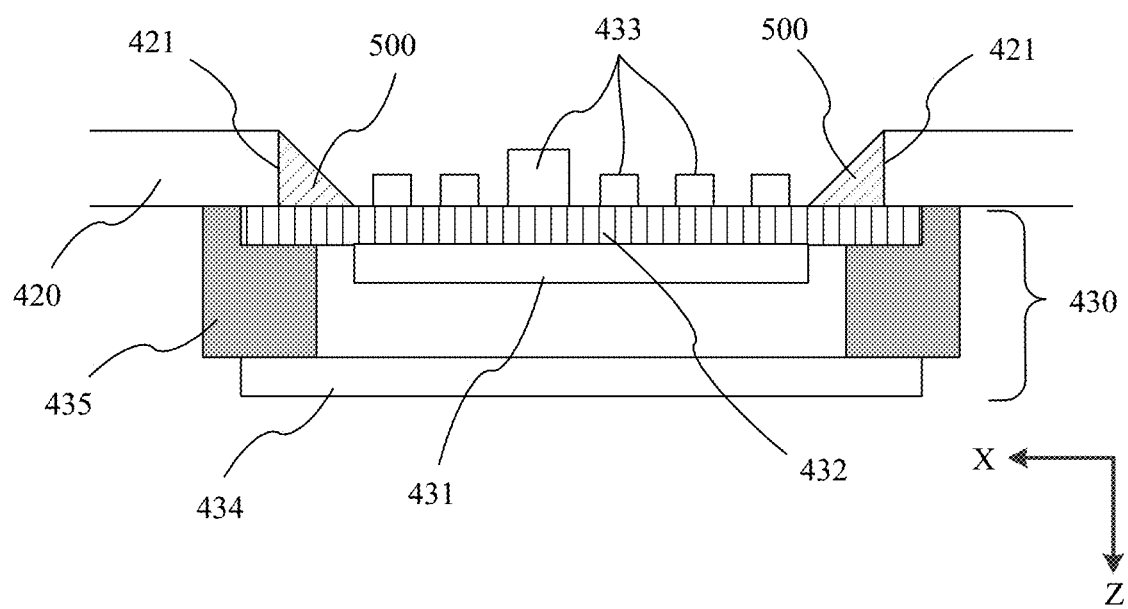
FIG. 4 is a sectional view showing a section taken along a line A-A in FIG. 3.

Referring now to FIGS. 3 and 4, a description will be given of the configuration of the image sensor 430. FIG. 3 illustrates the shift holder 420 and the image sensor 430 viewed from the rear side. FIG. 3 omits the driving coils 460a, 460b, and 460c. FIG. 4 illustrates a section when the shift holder 420 and the image sensor 430 are taken along the line A-A in FIG. 3.

As illustrated in FIG. 4, the image sensor 430 has a packageless structure in which a sensor chip 431 such as a CMOS image sensor is directly mounted on the front surface (first substrate surface) of an image pickup board 432. The sensor chip 431 is a semiconductor chip formed on a silicon substrate, and outputs an image signal according to incident light. The rectangular sensor chip 431 has a long side parallel to the X direction and a short side parallel to the Y direction.

The image pickup board 432 is a rectangular printed circuit board made of glass epoxy or the like, and is electrically connected to the sensor chip 431 by bonded wires using a gold wire or the like. The image pickup board 432 is disposed so as to cover the front surface of the opening 421 of the shift holder 420, and fixed onto the shift holder 420 by an adhesive 500 applied to the inner surfaces of the left and right sides of the opening 421 and the rear surface (second substrate surface) of the image pickup board 432 opposite to the front surface mounted with the sensor chip 431. A detailed description will be given later of the method of adhering and fixing the image pickup board 432 to the shift holder 420.

Various electronic components 433, such as capacitors, resistors, coils, regulators, and IC chips, for operating the sensor chip 431 are mounted on the rear surface of the image pickup board 432. A rectangular frame member 435 is adhered and fixed to the outer circumferential portion of the image pickup board 432 on the front surface of the shift holder 420 and the outer circumferential portion of the sensor chip 431 on the front surface (surface on the image pickup board side) of the image pickup board 432. A rectangular cover glass (cover member) 434 that covers the sensor chip 431 is adhered and fixed to the front end surface of the frame member 435. The sensor chip 431 is sealed by the frame member 435 and the cover glass 434 supported by the frame member 435, and the sensor chip 431 is protected. The frame member 435 may be made of a resin material, or made of a ceramic material or a metal material.

A description will now be given of a method of adhering and fixing the image pickup board 432 to the shift holder 420. The opening 421 of the shift holder 420 disposed on the rear side of the image pickup board 432 has an inner size wider than the outer size of the sensor chip 431 in order to secure a mounting space for the electronic component 433 on the rear surface of the image pickup board 432. The left and right sides of the opening 421 are parallel to the left and right short sides of the sensor chip 431 and the image pickup board 432, respectively, and the upper and lower sides of the opening 421 are parallel to the long sides of the sensor chip 431 and the image pickup board 432, respectively.

As described above, the image sensor 430 is disposed at a predetermined distance from the mount surface of the mount part 20. Since the optical low-pass filter 410, an unillustrated shutter unit, and the like are disposed between the mount unit 20 and the image sensor 430, it is difficult to further dispose the shift holder 420 here. On the other hand, there are few restrictions on the arrangement of the shift holder 420 on the rear side of the image sensor 430. Therefore, the space in the camera 100 in the Z direction can be effectively used by disposing the shift holder 420 on the rear side of the image sensor 430.

Thus, the adhesive 500 is continuously and linearly applied to the inner surfaces of the left and right sides of the opening 421 of the shift holder 420 disposed on the rear side of the image sensor 430, parallel to the short side of the image pickup board 432. The adhesive 500 is cured in a contact state with the inner surfaces of the left and right sides of the opening 421 and the adhesion area (adhesion margin) outside the electronic component 433 on the rear surface of the image pickup board 432. Thereby, the image pickup board 432 (or the image sensor 430) is adhered and fixed to the shift holder 420. A photocurable acrylic adhesive, an epoxy-based ultraviolet curable adhesive, or the like can be used for the adhesive 500.

An application length La of the adhesive 500 illustrated in FIG. 4 in the vertical direction may be sufficiently long because it is necessary to secure the adhesion strength which the image sensor 430 does not fall off due to the drop impact of the camera. Therefore, the adhesive 500 may be applied in a continuous linear shape as long as possible within the range of the vertical lengths of the left and right sides of the opening 421. More specifically, the adhesive 500 may be applied on the inner surfaces of the left and right sides of the opening 421 with a length Ls of the short side of the sensor chip 431 or longer. In other words, the following relationship may be established:

Application length La of adhesive 500≥Short side length Ls of sensor chip 431

However, as long as a sufficient adhesion strength can be ensured, the adhesive 500 may be applied discontinuously (locally) to the inner surfaces of the left and right sides of the opening 421. Even in this case, the total application length of the locally applied adhesive 500 may be set to the length Ls of the short side of the sensor chip 431 or longer.

As illustrated in FIG. 4, the adhesive 500 is applied across the opening 421 of the shift holder 420 and the image pickup board 432. Instead of the image pickup board 432, the rear end surface of the frame member 435 disposed on the outer circumference of the image pickup board 432 and the shift holder 420 may be adhered to each other, but in order to secure the adhesion area on the rear end surface of the frame member 435, it is necessary to make the frame member 435 much larger than the image pickup board 432, and the image sensor 430 consequently becomes larger. The opening 421 of the shift holder 420 also needs to be larger than that of the image pickup board 432, and the shift holder 420 consequently becomes larger. Therefore, in order to make small the image sensor 430 and the shift holder 420, the shift holder 420 and the image pickup board 432 may be adhered to each other.

A description will now be given of the merit of adhering the image sensor 430 using the left side and the right side of the opening 421. As described above, the shift holder 420 is supported in the optical axis direction when it contacts the three halls 490. As illustrated in FIG. 3, the ball receiving surfaces 422*a*, 422*b*, and 422*c* that contact the three balls 490 of the shift holder 420 are located outside the upper and lower sides of the image pickup board 432 in the Y direction parallel to the short side of the image pickup device 430. On the other hand, in the X direction parallel to the long side of the image sensor 430, two locations (422*a*, 422*b*) are located outside and one place (422*c*) is located inside the left and right sides of the image pickup board 432.

The positions of the ball receiving surfaces 422*a*, 422*b*, and 422*c* at these three locations (referred to as support positions hereinafter) may be set so as to satisfy the following three conditions. First, in order to improve the support stability of the shift holder 420 in the optical axis direction, the center of gravity of the triangle connecting the support positions and the center of gravity of the image sensor 430 (which may be regarded as the same position as the center of gravity of the image sensor 432). Second, similarly, in order to improve the support stability, the triangle connecting the support positions is made as close as possible to the equilateral triangle. Third, since the left and right sides of the image pickup board 432 are shorter than the upper and lower sides, support positions are provided one by one outside of the upper and lower sides of the image pickup board 432 to improve the layout efficiency in the camera 100. Therefore, at least one support position is provided outside the upper side of the image pickup board 432 and the outside the lower side of the image pickup board 432, and if one position remains, a position satisfying the above three conditions may be provided.

Figure 5A:
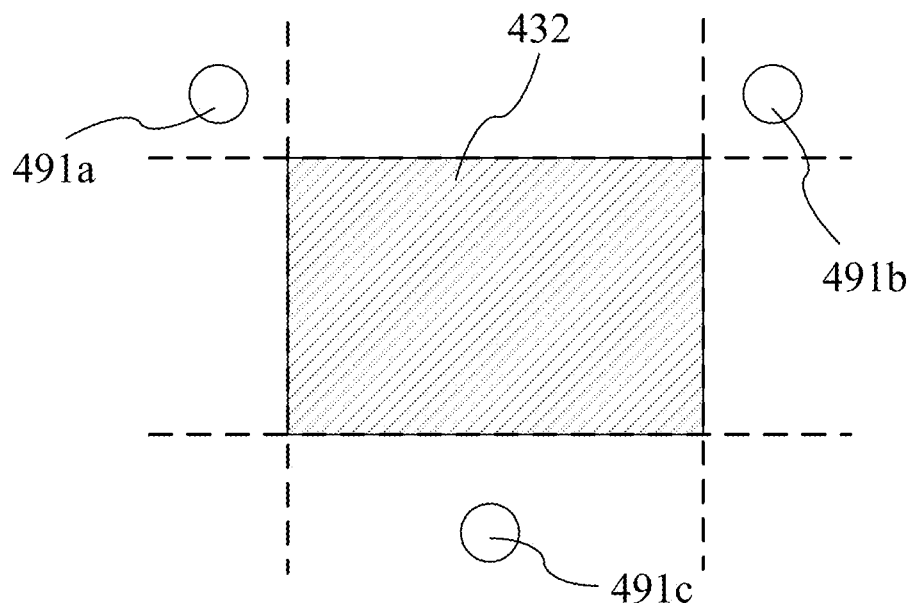
FIGS. 5A to 5C illustrate a relationship between a support position of a shift holder and an image pickup board in a first embodiment.
Figure 5B:
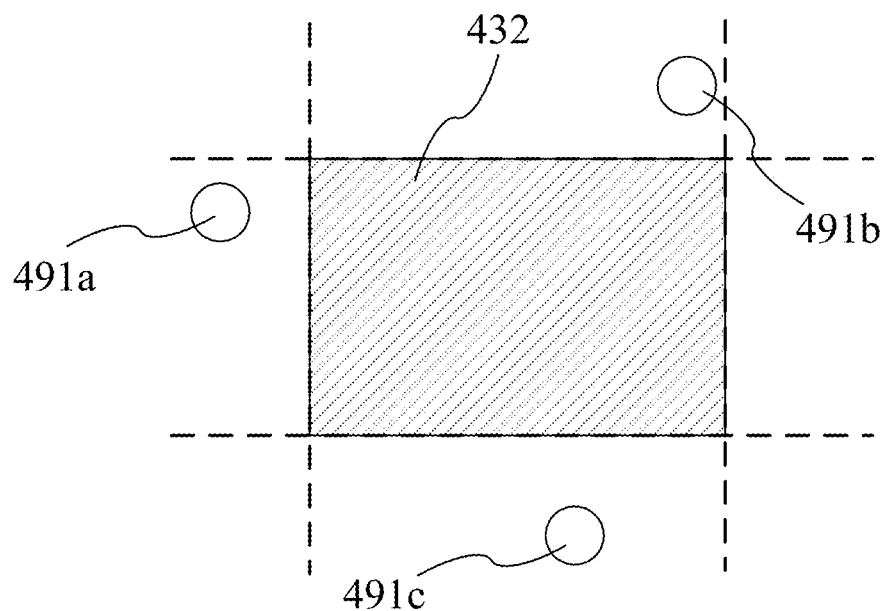
Figure 5C:
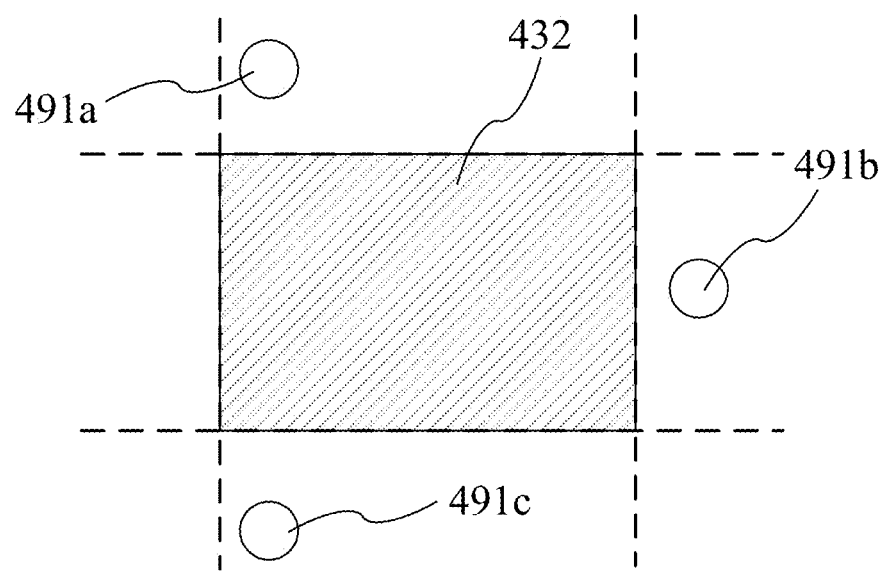

FIGS. 5A to 5C illustrates an example of three support positions different from the three support positions illustrated in FIG. 3 that satisfy the above three conditions. These figures schematically illustrate the image pickup board 432 and the support positions 491*a*, 491*b*, and 491*c* at three locations. In each of the examples, the support positions 491*a* to 491*c* are provided at least one outside the upper side (one long side) of the image pickup board 432 and at least one outside the lower side (the other long side).

Figure 6:
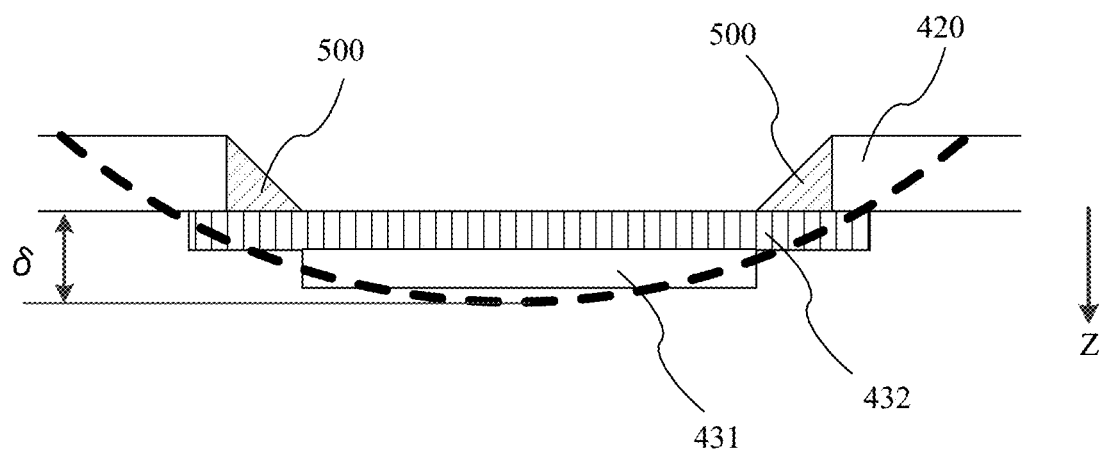
FIG. 6 illustrates thermal strains of the shift holder and the image pickup board in the first embodiment.

Referring now to FIG. 6, a description will be given of a thermal distortion due to the temperature change of the image sensor 430. The position accuracy of the sensor chip 431 of the image sensor 430 in the Z direction focus direction) is very important, and it is necessary to reduce the deformation of the image sensor 430 due to the thermal distortion at the environmental temperature where the operation of the camera 100 is guaranteed.

The shift holder 420 is made of a metal material, such as magnesium, aluminum or stainless steel. On the other hand, the image pickup board 432 adhered and fixed to the shift holder 420 is formed of glass epoxy or the like as described above. When these linear expansion coefficients are compared with each other the linear expansion coefficient of the shill holder 420 is several times larger. Therefore, when the camera 100 is placed at a high temperature or a low temperature, the thermal distortion occurs due to the difference in the linear expansion coefficient, and as illustrated by a broken line in FIG. 6, the image pickup board 432 warps in the focus direction together with the sensor chip 431. FIG. 6 schematically illustrates only the shift holder 420, the image pickup board 432, the sensor chip 431, and the adhesive 500 in a state in which the image pickup board 432 is warped by a deformation amount δ so as to be convex in the +Z direction when the environmental temperature of the camera 100 is changed from the normal temperature (about 23° C.) to the low temperature (about −10° C. to −20° C.).

Figure 7:
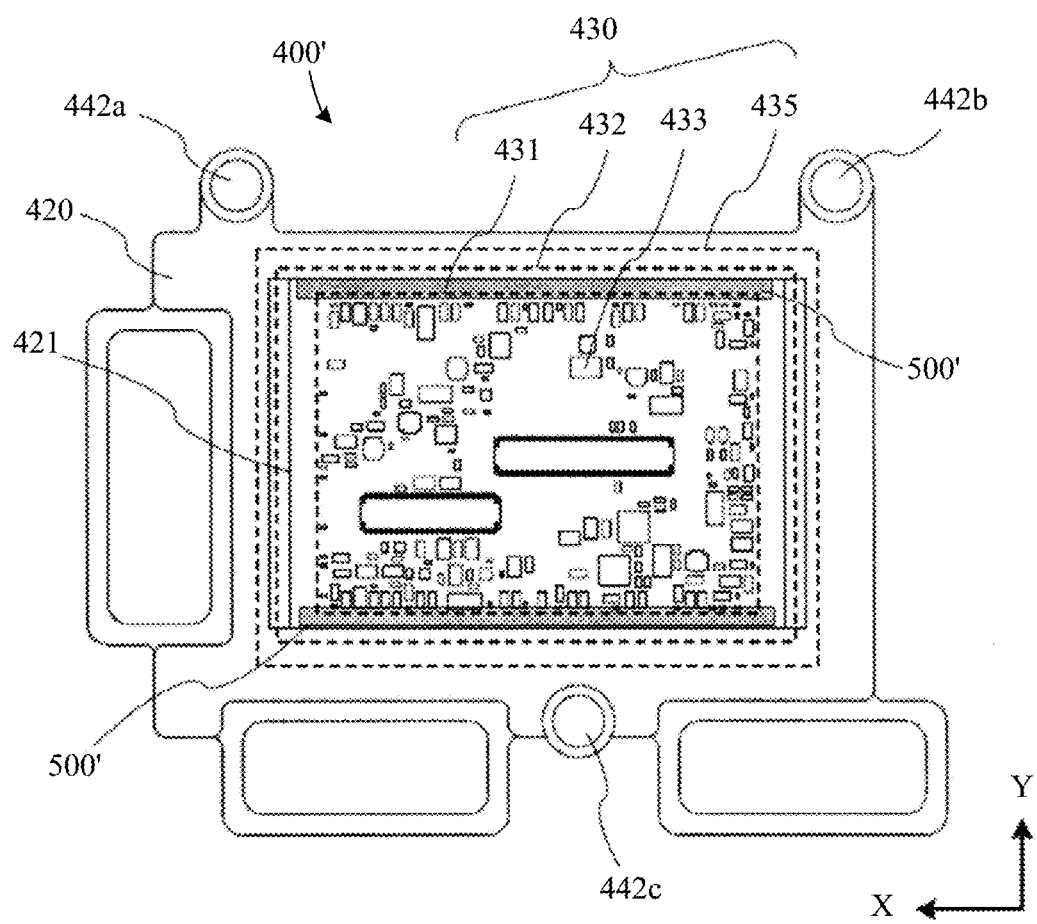
FIG. 7 is another rear view of the image pickup unit.

Now assume that δ1 is a deformation amount δ of the image pickup board 432 under a specific environmental temperature when the image sensor 430 is fixed with the adhesive 500 onto the left side and the right side of the opening 421 of the shift holder 420. As illustrated in FIG. 7, δ2 is a deformation amount δ of the image pickup board 432 under a specific environmental temperature when the image sensor 430 is fixed with the adhesive 500' onto the upper side and the lower side of the opening 421. As described above, the image sensor 430 (image pickup board 432) is disposed on the front side of the shift holder 420, and the conditions and the linear expansion coefficient of the three support positions of the shift holder 420 are larger than those of the image pickup hoard 432. When these facts are considered, it is experimentally and analytically confirmed that the deformation amount δ satisfies δ1<δ2.

The support position largely depends on the deformation amount δ, and if the three support positions can be positioned inside the upper side and the lower side of the image pickup board 432, the deformation amount δ satisfies δ1<δ2. In other words, the deformation amount δ when the image pickup board 432 is adhered and fixed to the upper and lower sides of the opening 421 is smaller than that when the image pickup board 432 is adhered and fixed to the left side and the right side of the opening 421. Therefore, where the three support positions are outside the upper and lower sides of the image pickup board 432 as in this embodiment, the deformation amount δ becomes smaller when the image pickup hoard 432 may be adhered and fixed to the left and right sides of the opening 421 in the shift holder 420.

If the deformation amount caused by the thermal distortion when the image pickup board 432 is adhered and fixed to the left and right sides of the opening 421 is not exceeded, the image pickup board 432 may be adhered and fixed to the upper and lower sides of the opening 421. In this case, local adhesion may be performed. The position of the image sensor 430 is adjusted relative to the shift holder 420 in the XY plane, and the image sensor 432 is first locally, weakly, and tentatively adhered to the upper and lower sides of the opening 421 so that the position of the image sensor 430 does not shift. Thereafter, the image pickup board 432 may be adhered to the left and right sides of the opening 421 in order to secure the necessary adhesion strength.

As described above, this embodiment can ensure the sufficient adhesion holding strength between the image sensor 430 having a packageless structure and the shift holder 420, and restrain the image sensor 430 from deforming in the focus direction during temperature changes.

Second Embodiment

Figure 8:
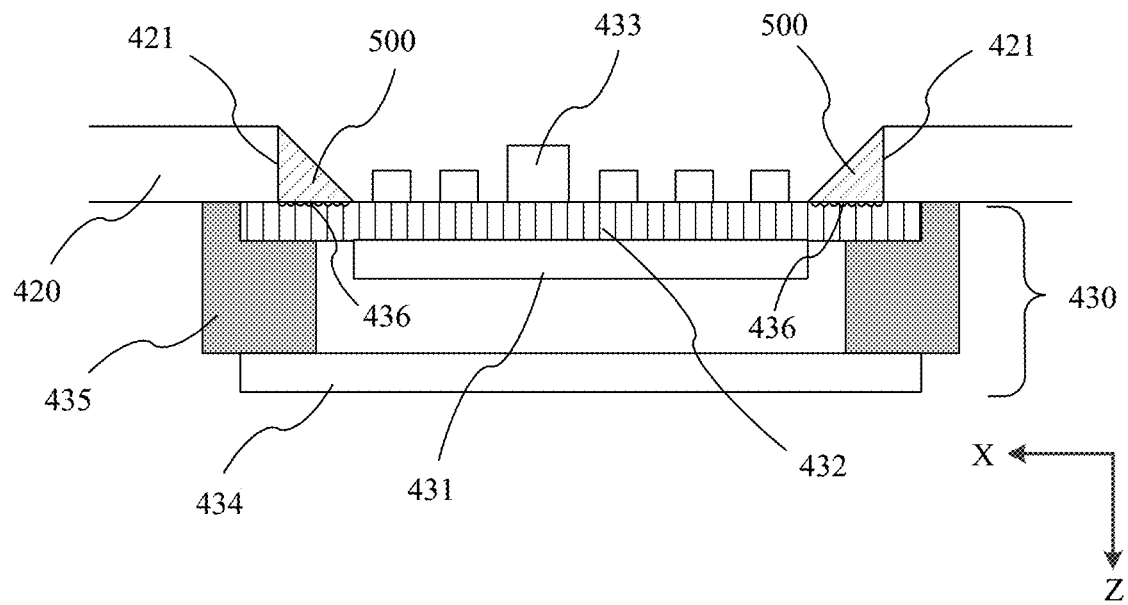
FIG. 8 is a sectional view showing an image pickup unit according to a second embodiment of the present invention.

Referring now to FIG. 8, a description will be given of a method of adhering and fixing the image sensor 430 and the shift holder 420 according to a second embodiment of the present invention. FIG. 8 illustrates a section of the shift holder 420 and the image sensor 430, similar to FIG. 4

This embodiment provides an uneven portion 436 on the rear surface of the image pickup board 432 in an area which the adhesive 500 contacts. The uneven portion may have any shape, such as a dimple shape and a minute uneven shape having a rough surface. By providing the uneven portion 436, the contact area between the rear surface of the image pickup board 432 and the adhesive 500 can be increased, and the adhesion strength can be further increased.

The same uneven portion may be provided to the rear end surface of the frame member 435 to further increase the adhesion strength between the frame member 435 and the shift holder 420.

Third Embodiment

Figure 9:
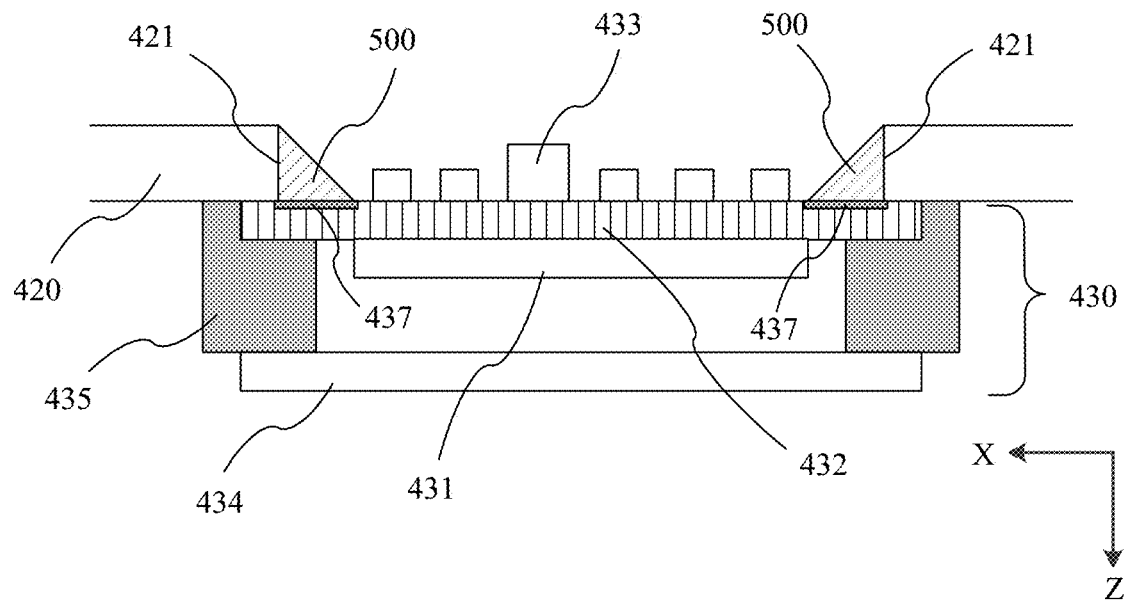
FIG. 9 is a sectional view showing an image pickup it according to a third embodiment of the present invention.

Referring now to FIG. 9, a description will be given of a method of adhering and fixing the image sensor 430 and the shift holder 420 according to a third embodiment of the present invention. FIG. 9 illustrates a section of the shift holder 420 and the image sensor 430, similar to FIG. 4.

This embodiment provides the metal portion 437 in an area on the rear surface of the image pickup board 432 which the adhesive 500 contact. More specifically, a copper foil pattern for adhesion is provided on the rear surface of the image pickup board 432. The copper foil pattern may have any shape, such as a solid shape or a pad shape. When an anaerobic adhesive is used for the adhesive 500, copper, which is an active material, can promote the polymerization reaction, rather than glass epoxy, which is a material of the image pickup board 432, and can improve the adhesion strength.

Fourth Embodiment

Figure 10:
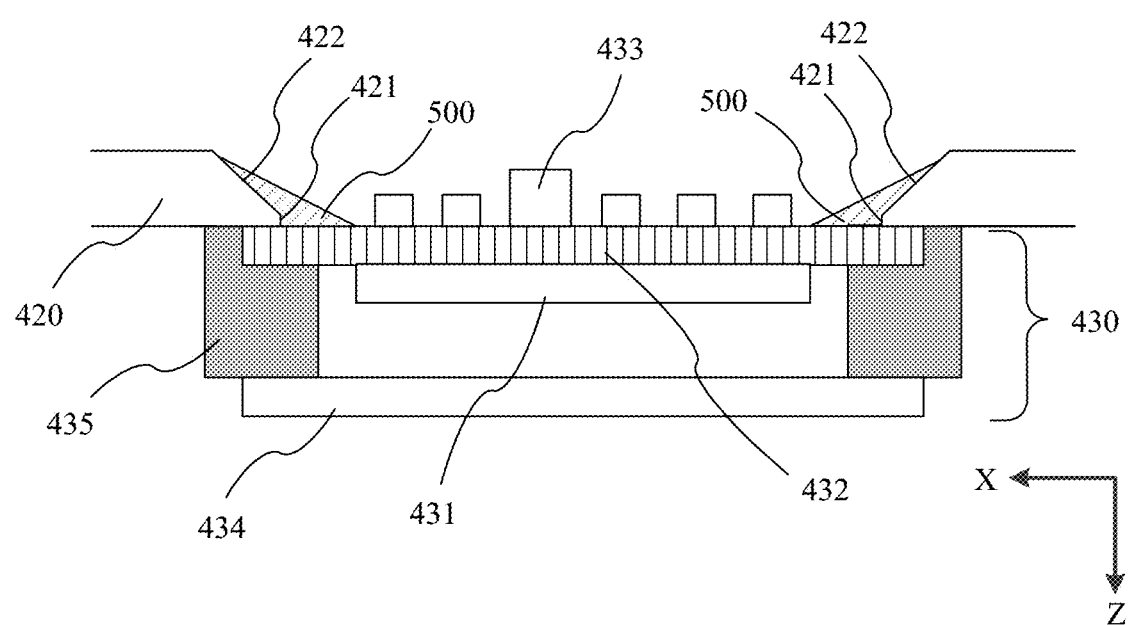
FIG. 10 is a sectional view showing an image pickup unit according to a fourth embodiment of the present invention.

Referring now to FIG. 10, a description will be given of a method of adhering and fixing the image sensor 430 and the shift holder 420 according to a fourth embodiment of the present invention. FIG. 10 illustrates a cross section of the shift holder 420 and the image sensor 430 similar to FIG. 4.

This embodiment sets the inner surfaces of the left and right sides of the opening 421 of the shift holder 420, that is, surfaces to which the adhesive 500 is applied, to a tapered surface 422 that inclines to the opening direction (Z direction) of the opening 421 so that the opening size expands toward the rear side opposite to the image sensor side. Thereby, the maximum thickness of the adhesive 500 in the Z direction becomes larger than the thickness of the shift holder 420, and the adhesion strength becomes higher than that when the inner surfaces of the left and right sides of the opening 421 are parallel to the Z direction as illustrated in FIG. 4.

When a force is applied in a direction in which the shift holder 420 and the image sensor 430 are peeled off, the adhesive 500 on the tapered surface 422 restricts the peeling off of the image sensor 430 and the shift holder 420 and increases the adhesion strength. By combining the tapered surface 422 in this embodiment with the uneven portion in the second embodiment and the metal portion of the third embodiment, the adhesion strength can be made much higher.

The second to fourth embodiments described above can also suppress deformations of the image sensor 430 in the focus direction caused by the temperature changes while ensuring the sufficient adhesion holding strength between the image sensor 430 having a packageless structure and the shift holder 420.

The image pickup units 400 according to the first to fourth embodiments support the shift holder 420 through the balls 490 at three locations in the optical axis direction, and provide the image stabilization operation that reduces the image blurs because the shift holder 420 shifts in the X and Y directions or rolls around the Z axis.

However, even an image pickup unit that does not provide such an image stabilization operation can employ the adhering and fixing method of the image sensor to the holder described in the first to fourth embodiments. In this case, the holder may be set to the support position illustrated in FIGS. 3 and 5A to 5C, and directly fixed to the body base of the camera using screws instead of balls.

While each of the above embodiments has described a lens interchangeable type camera as an image pickup apparatus equipped with an image pickup unit, the image pickup apparatus may include a compact lens-integrated camera or a portable terminal such as a smartphone.

Each of the above embodiments can suppress deformations of the image sensor in the focus direction caused by the temperature changes while ensuring the sufficient adhesion holding strength between the image sensor having a packageless structure and the holder.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-025077, filed on Feb. 18, 2020 which is hereby incorporated by reference herein in its entirety.

What is claimed is:

1. An image pickup unit comprising:
   an image sensor in which a sensor chip is mounted on a first substrate surface of a substrate having a long side and a short side, and electronic components are mounted on a second substrate surface opposite to the first substrate surface; and
   a holder having an opening and configured to hold the image sensor, wherein the opening has an inner surface parallel to the short side of the substrate, and
   wherein the image sensor is fixed to the holder with an adhesive that contacts the inner surface and an adhesion area on the second substrate surface of the substrate that is outside the electronic components.

2. The image pickup unit according to claim 1, wherein a linear expansion coefficient of the holder is larger than that of the substrate.

3. The image pickup unit according to claim 1, wherein the adhesive continuously and linearly contacts the inner surface and the adhesion area.

4. The image pickup unit according to claim 1, wherein the adhesive on the inner surface is equal to or longer than the sensor chip in a direction parallel to the short side.

5. The image pickup unit according to claim 1, wherein the adhesion area of the second substrate surface has an uneven shape.

6. The image pickup unit according to claim 1, wherein the adhesion area of the second substrate surface has a metal portion.

7. The image pickup unit according to claim 1, wherein the inner surface of the opening includes a tapered surface inclined to an opening direction of the opening.

8. The image pickup unit according to claim 1, further comprising a frame member adhered to an outer circumference of the sensor chip on the first substrate surface of the substrate and an outer circumference of the substrate on a surface of the holder on a substrate side, and configured to support a cover member that covers the sensor chip.

9. The image pickup unit according to claim 1, further comprising members configured to support the holder and arranged at three locations including at least one location outside one long side of the substrate and at least one location outside another long side in a direction parallel to the short side.

10. The image pickup unit according to claim 1, further comprising an actuator configured to move the holder in a plane parallel to the long side and the short side.

11. An image pickup apparatus comprising:
    an image pickup unit; and
    a body configured to holds the image pickup unit, wherein the image pickup unit includes:
    an image sensor in which a sensor chip is mounted on a first substrate
    surface of a substrate having a long side and a short side, and electronic components are mounted on a second substrate surface opposite to the first substrate surface; and
    a holder having an opening and configured to hold the image sensor, wherein the opening has an inner surface parallel to the short side of the substrate, and
    wherein the image sensor is fixed to the holder with an adhesive that contacts the inner surface and an adhesion area on the second substrate surface of the substrate that is outside the electronic components.

* * * * *